United States Patent [19]
Huang

[11] Patent Number: 6,086,402
[45] Date of Patent: Jul. 11, 2000

[54] SOCKET CONNECTOR

[75] Inventor: Yao-Chi Huang, Yung-Ho, Taiwan

[73] Assignee: Hon Hai Precision Ind. Co., Ltd., Taipei Hsien, Taiwan

[21] Appl. No.: 09/295,477

[22] Filed: Apr. 19, 1999

[51] Int. Cl.[7] .................................................. H01R 13/625
[52] U.S. Cl. ............................................................. 439/342
[58] Field of Search ............................... 439/71, 73, 331, 439/342, 259

[56] References Cited

U.S. PATENT DOCUMENTS

| | | | |
|---|---|---|---|
| 4,498,725 | 2/1985 | Bright et al. | |
| 5,313,364 | 5/1994 | Omori et al. | 439/74 |
| 6,004,141 | 12/1999 | Abe et al. | 439/73 |
| 6,004,152 | 12/1999 | Walkup et al. | 439/342 |

*Primary Examiner*—Khiem Nguyen
*Attorney, Agent, or Firm*—Wei Te Chung

[57] ABSTRACT

A socket connector includes a base defining slots for receiving and retaining contact elements therein. A cover adapted to support an electronic device, such as a central processing unit (CPU), defines holes corresponding to the slots of the base with pins of the CPU extending therethrough. The cover is positioned on the base with the pins partially received in the slots and is moved with respect thereto by an actuation device exerting a force on an edge thereof. A protection frame includes several segments forming channels for snugly receiving edges of the cover thereby protecting the cover from damage caused by the actuation force. The frame substantially extends along edges of the cover thereby enhancing the rigidity of the cover and preventing the cover from experiencing warpage during manufacture and operation.

6 Claims, 3 Drawing Sheets

SOCKET CONNECTOR

BACKGROUND OF THE INVENTION

1. Field of the Invention

The present invention generally relates to a socket connector, and in particular to a mobile socket connector having a mechanically reinforced cover.

2. The Prior Art

A mobile socket connector comprises a base mounted to a circuit board and a cover slidably positioned thereon. The base defines a plurality of slots therein for receiving and retaining contact elements electrically connected to the circuit board. The cover defines a plurality of holes corresponding to the slots of the base and is adapted to retain an external device, such as a central processing unit (CPU). Pins of the CPU extend through the holes of the cover and are partially received in the slots of the base. A force is selectively applied to the cover for moving the cover with respect to the base thereby engaging the pins with the contact elements. Conventionally, the cover is made of plastic and may be damaged by a force exerted thereon to move the cover.

It is thus desirable to have a socket connector having a reinforced structure for protecting the cover from being damaged by an actuation force.

SUMMARY OF THE INVENTION

Accordingly, an object of the present invention is to provide a socket connector having a reinforced cover.

Another object of the present invention is to provide a socket connector comprising a cover reinforced by a metal frame for suppressing warpage of the cover.

A further object of the present invention is to provide a socket connector comprising a cover reinforced by a rigid frame for enhancing the rigidity thereof.

To achieve the above objects, an electrical connector in accordance with the present invention comprises a base defining slots for receiving and retaining contact elements therein. A cover adapted to support an electronic device, such as a central processing unit (CPU), defines holes corresponding to the slots of the base with pins of the CPU extending therethrough. The cover is positioned on the base with the pins partially received in the slots and is moved with respect thereto by an actuation device exerting a force on an edge thereof. A protection frame includes several segments forming channels for snugly receiving edges of the cover thereby protecting the cover from damage caused by the actuation force. The frame substantially extends along edges of the cover thereby enhancing the rigidity of the cover and preventing the cover from experiencing warpage during manufacture and operation.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
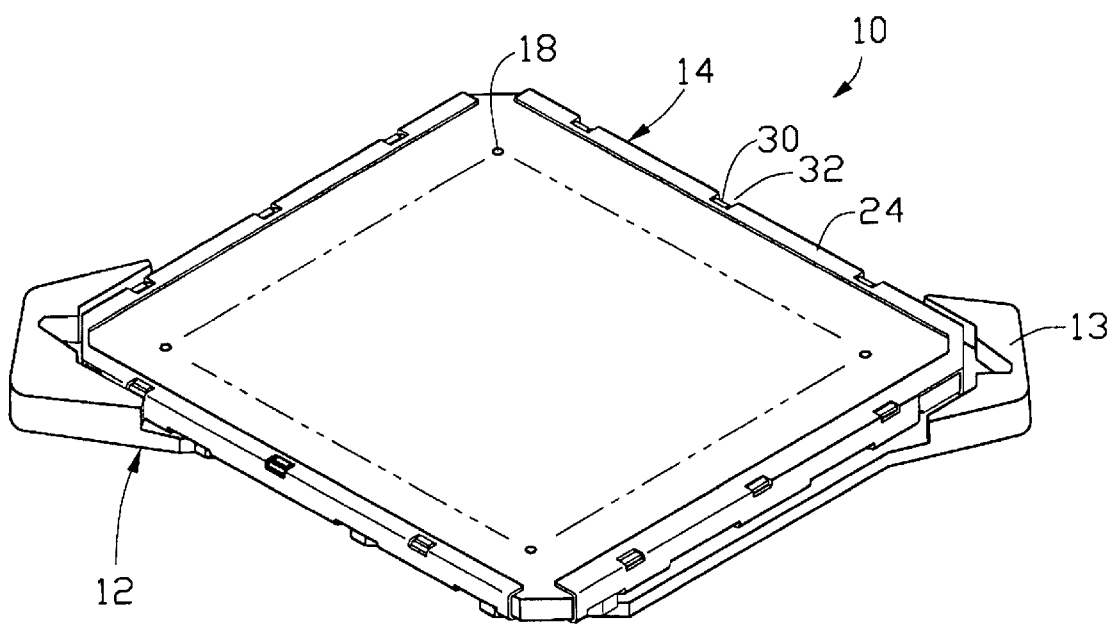
FIG. 1 is a perspective view of a socket connector in accordance with the present invention.
Figure 2:
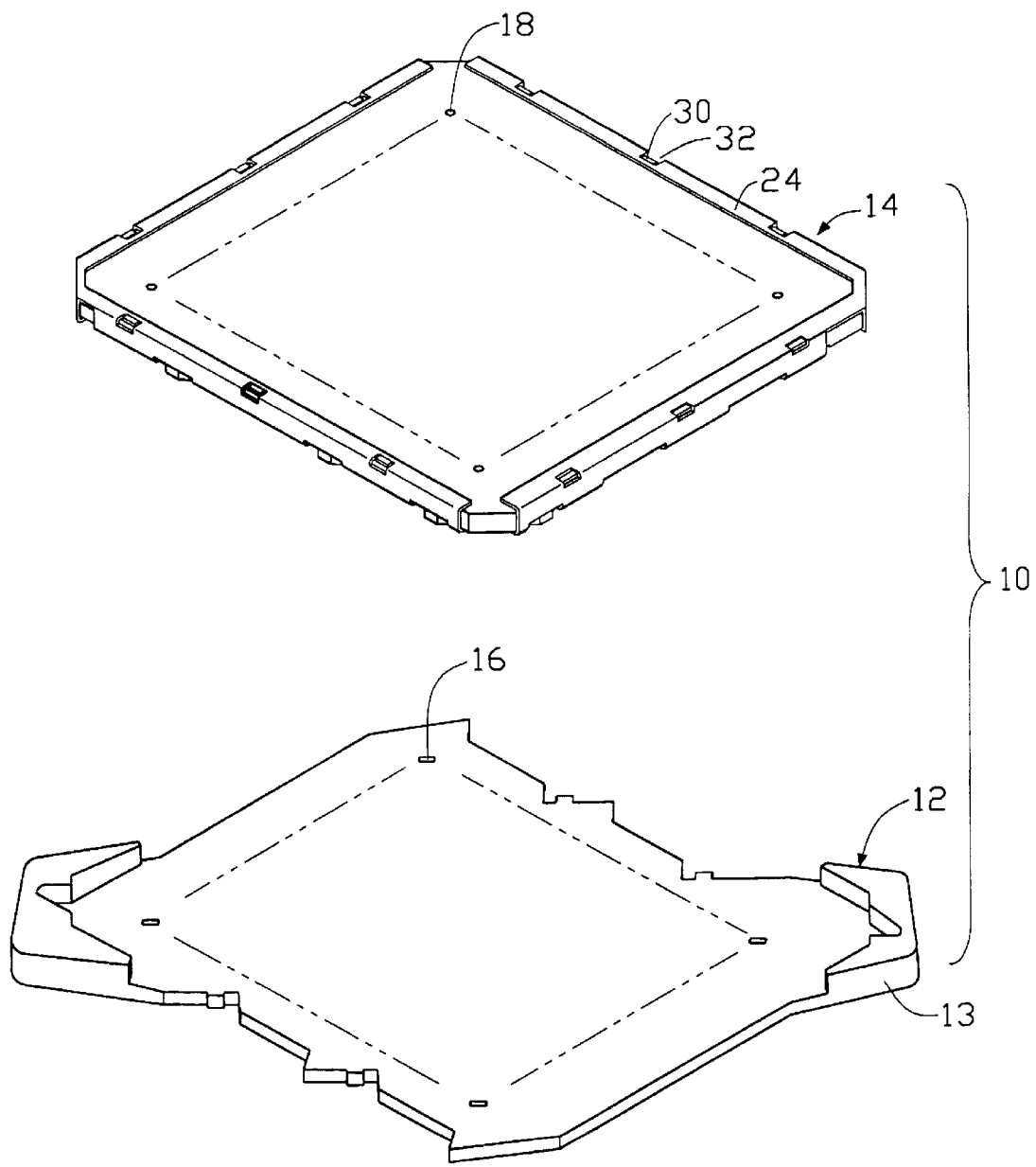
FIG. 2 is an exploded view of the socket connector.

Referring to the drawings and in particular to FIGS. 1 and 2, a socket connector in accordance with the present invention, generally designated by reference numeral 10, comprises a base 12 and a cover 14 movably supported on the base 12 and adapted to retain an external device, such as a central processing unit (not shown). The base 12 defines a plurality of slots 16 for receiving and retaining contact elements (not shown) therein. The cover 14 defines a plurality of through holes 18 corresponding to the slots 16 for receiving pins of the external device whereby the pins extend through the holes 18 and are partially received in the slots 14. Actuation means (not shown), such as a camming mechanism or a screwdriver, may be incorporated in or used with the connector 10 for moving the cover 14 with respect to the base 12 in a diagonal direction along the line between the two ears 13 of the base 12 thereby engaging the pins of the external device with the contact elements and establishing electrical connection therebetween.

Figure 3:
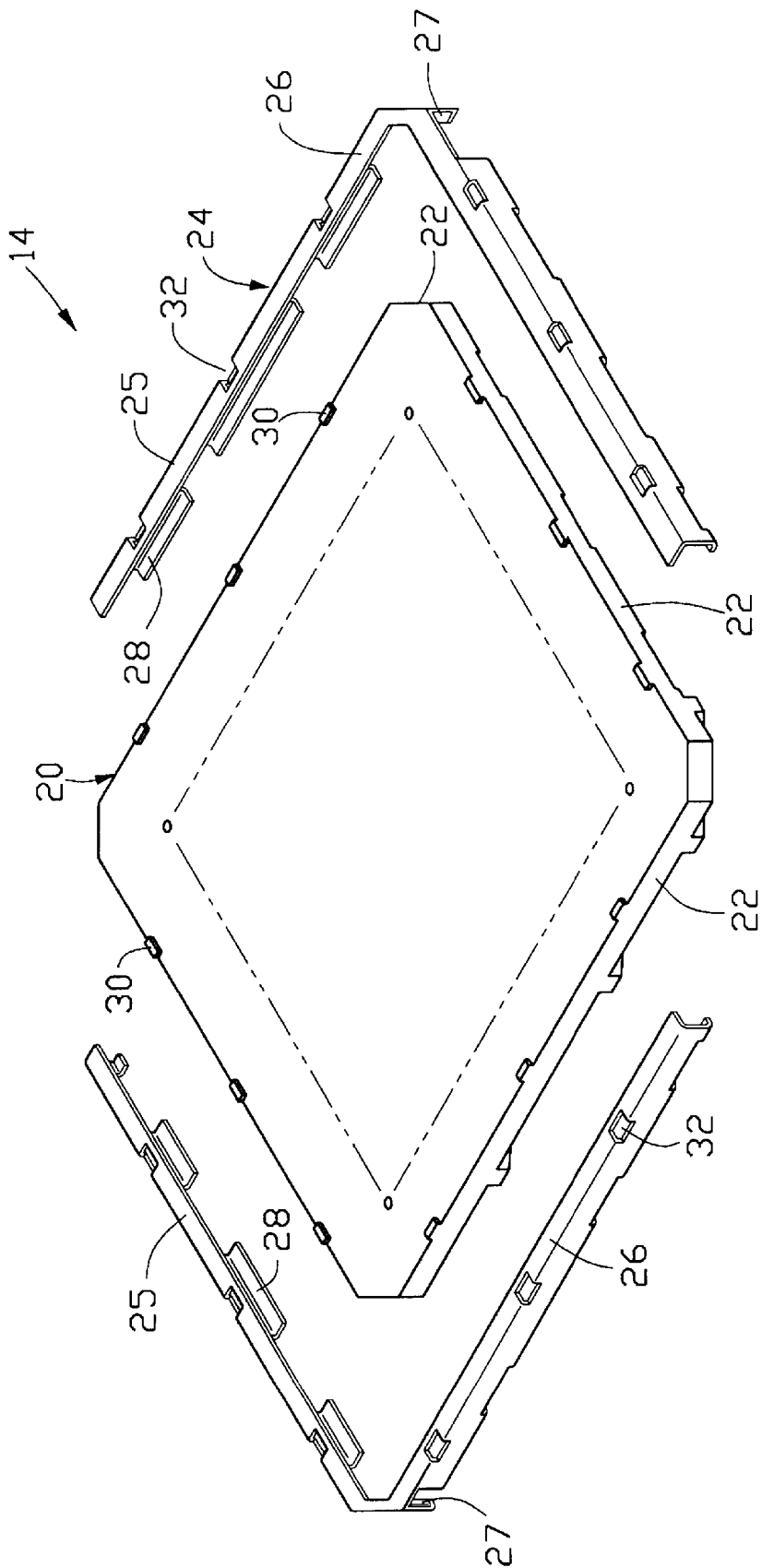
FIG. 3 is an exploded view of a cover of the socket connector.

Also referring to FIG. 3, the cover 14 comprises a flat body 20 made of insulative material, such as plastic, and a reinforcing frame 24 made of a rigid material, such as metal. The reinforcing frame 24 comprises several segments 26 each defining at least one channel 28 for snugly receiving a corresponding edge 22 of the flat body 20. Projections 30 are formed along the edges 22 of the flat body 20 for engaging with openings 32 formed in the reinforcing frame 24 whereby the reinforcing frame 24 is secured to the flat body 20.

The frame 24 may extend along only a portion of a perimeter of the flat body 20 where the actuation force is exerted. Preferably, the frame 24 is substantially co-extensive with the perimeter for not only protecting the flat body 20 from the actuation force, but also for enhancing the rigidity thereof and suppressing warpage during manufacture and operation. It is also noted that the reinforcing frame 24 includes two right angle sections 25 respectively attached to four edges of the cover 14 wherein the intersection portion 27 of each right angle section 25 confronts the corresponding ear 13 of the base 12 for engagement with a blade type tool which is used to actuate the cover 14 to move with regard to the base 12 along the diagonal direction. The reinforcing frame 24 along four edges of the cover 14 may efficiently resist the actuation forces which is applied along the diagonal direction to the cover 14 and is neither parallel to nor perpendicular to any of the edges.

Although the present invention has been described with reference to the preferred embodiment, it is apparent to those skilled in the art that a variety of modifications and changes may be made without departing from the scope of the present invention which is intended to be defined by the appended claims.

What is claimed is:

1. An electrical connector comprising a base and a cover movably supported on the base and adapted to retain an external device, the base defining slots for receiving and retaining contact elements therein, the cover defining holes therein through which pins of the external device extend for being partially received in the slots whereby when the cover is moved by an external tool, the pins are brought into engagement with the contact pins for establishing electrical connection therebetween, the cover comprising a flat body made of insulative material and a reinforcing frame mounted to and extending along at least a portion of a perimeter of the body for mechanically reinforcing the flat body.

2. The electrical connector as claimed in claim 1, wherein the reinforcing frame is substantially co-extensive with the perimeter of the body.

3. The electrical connector as claimed in claim 1, wherein the body is flat having edges and the reinforcing frame comprises segments, each segment forming at least one U-channel snugly receiving the corresponding edge of the flat body therein.

4. The electrical connector as claimed in claim 3, wherein openings are defined in each segment of the reinforcing frame for receivingly engaging with projections formed on the flat body thereby securing the reinforcing frame to the body.

5. The electrical connector as claimed in claim 1, wherein the reinforcing frame is made of metal.

6. An electrical connector comprising a base and a cover moveably supported on the base, the base defining slots for receiving and retaining contact elements therein, the cover defining therein holes through which pins of an external device extend, the cover comprising a body and a reinforcing frame attached to at least a portion of edges of the body wherein the cover is actuated by an external tool to move with regard to the base along a diagonal direction which is neither parallel to nor perpendicular to any of said edges of the cover.

* * * * *